United States Patent
Choi et al.

(10) Patent No.: US 9,356,079 B2
(45) Date of Patent: May 31, 2016

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-Do (KR)

(72) Inventors: Man-Seob Choi, Yongin (KR); Katsumasa Yoshii, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/527,637

(22) Filed: Oct. 29, 2014

(65) Prior Publication Data
US 2015/0372066 A1    Dec. 24, 2015

(30) Foreign Application Priority Data
Jun. 19, 2014    (KR) .......................... 10-2014-0075050

(51) Int. Cl.
| | |
|---|---|
| *H01L 21/033* | (2006.01) |
| *G02F 1/1335* | (2006.01) |
| *H01L 27/32* | (2006.01) |
| *H01L 51/56* | (2006.01) |
| *H01L 51/52* | (2006.01) |

(52) U.S. Cl.
CPC ........ *H01L 27/3246* (2013.01); *H01L 51/5218* (2013.01); *H01L 51/5221* (2013.01); *H01L 51/5271* (2013.01); *H01L 51/5275* (2013.01); *H01L 51/5284* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 5,910,706 A * | 6/1999 | Stevens et al. ................ 313/498 |
| 6,828,725 B2 | 12/2004 | Kimura | |
| 2002/0185967 A1* | 12/2002 | Friend ........................... 313/504 |
| 2005/0174524 A1* | 8/2005 | Yuh et al. ...................... 349/158 |
| 2006/0007302 A1* | 1/2006 | Numata et al. ................. 348/71 |

(Continued)

FOREIGN PATENT DOCUMENTS

| | | |
|---|---|---|
| JP | 2005-327535 A | 11/2005 |
| JP | 2009-44117 A | 2/2009 |

(Continued)

OTHER PUBLICATIONS

Hong et al., "Review Paper: Recent Developments in Light Extraction Technologies of Organic Light Emitting Diodes", Electronic Materials Letters, 2011, vol. 7, No. 2, pp. 77-91.

*Primary Examiner* — Calvin Choi
*Assistant Examiner* — Xiaoming Liu
(74) *Attorney, Agent, or Firm* — Knobbe Martens Olson & Bear LLP

(57) ABSTRACT

An organic light-emitting display apparatus includes a substrate, an optical layer formed over the substrate and a light emitting pixel formed over the optical layer. The optical layer includes a first refractive index layer portion having a first refractive index, a second refractive index layer portion having a second refractive index greater than the first refractive index. The second portion is disposed next to the first portion and contacts the first portion. The light emitting pixel includes a pixel electrode overlapping the first portion and comprising a first reflective layer, a pixel-defining film overlapping the second portion, an intermediate layer formed over the pixel electrode and comprising an organic light emission layer, and an opposite electrode formed over and overlapping the intermediate layer and the pixel-defining film and comprising a second reflective layer.

13 Claims, 4 Drawing Sheets

(56) References Cited

U.S. PATENT DOCUMENTS

| | | | |
|---|---|---|---|
| 2006/0110123 A1* | 5/2006 | Duine et al. | 385/146 |
| 2007/0085471 A1* | 4/2007 | Cok | 313/503 |
| 2007/0109470 A1* | 5/2007 | Hosoya | 349/110 |
| 2008/0303419 A1 | 12/2008 | Fukuda | |
| 2010/0032656 A1* | 2/2010 | Kwang et al. | 257/40 |
| 2012/0261701 A1 | 10/2012 | Yoo et al. | |
| 2013/0050619 A1* | 2/2013 | Kim et al. | 349/106 |
| 2013/0088785 A1* | 4/2013 | Yamamoto | 359/639 |
| 2014/0061605 A1 | 3/2014 | Kim et al. | |

FOREIGN PATENT DOCUMENTS

| | | |
|---|---|---|
| JP | 2010-271456 A | 12/2010 |
| KR | 10-0764826 B1 | 10/2007 |
| KR | 10-2012-0118305 A | 10/2012 |
| KR | 10-2013-0072753 A | 7/2013 |
| KR | 10-2014-00030842 A | 3/2014 |

* cited by examiner

ORGANIC LIGHT-EMITTING DISPLAY APPARATUS AND METHOD OF MANUFACTURING THE SAME

RELATED APPLICATION

This application claims the benefit of Korean Patent Application No. 10-2014-0075050, filed on Jun. 19, 2014, in the Korean Intellectual Property Office, the disclosure of which is incorporated herein in its entirety by reference.

BACKGROUND

1. Field

One or more embodiments of the present invention relate to an organic light-emitting display apparatus and a method of manufacturing the same.

2. Description of the Related Art

An organic light-emitting display apparatus is a self-emissive display apparatus that includes an organic light-emitting element that includes a hole injection electrode, an electron injection electrode, and an organic light emission layer that is formed between the hole injection electrode and the electron injection electrode. The organic light-emitting display apparatus generates light when excitons, which are generated by combining holes injected from the hole injection electrode with electrons injected from the electron injection electrode, drop from an excited state to a ground state.

Since the organic light-emitting display apparatus that is a self-emissive display apparatus does not need a separate light source, the organic light-emitting display apparatus may operate at a low voltage and may have a thin lightweight design, a wide viewing angle, a high contrast ratio, and a high response speed. The organic light-emitting display apparatus may be applied not only to a personal portable device such as an MP3 player or a mobile phone but also to a television (TV).

SUMMARY

One or more embodiments of the present invention include an organic light-emitting display apparatus and a method of manufacturing the same.

One aspect of the invention provides an organic light-emitting display apparatus comprising: a substrate comprising a major surface; an optical layer formed over the substrate and comprising: a first refractive index layer portion having a first refractive index, a second refractive index layer portion having a second refractive index greater than the first refractive index, wherein the second refractive index layer portion is disposed next to the first refractive index layer portion when viewed in a direction perpendicular to the major surface and contacts the first refractive index layer portion; and a light emitting pixel formed over the optical layer and comprising: a pixel electrode overlapping the first refractive index layer portion when viewed in the direction and comprising a first reflective layer, a pixel-defining film overlapping the second refractive index layer portion when viewed in the direction, an intermediate layer formed over the pixel electrode and comprising an organic light emission layer, and an opposite electrode formed over and overlapping the intermediate layer and the pixel-defining film when viewed in the direction and comprising a second reflective layer.

In the foregoing organic light-emitting display apparatus, the second reflective layer may comprise a portion overlapping the pixel-defining film and curved to form a concave mirror such that light beams emitted from the organic light emission layer and passed through the pixel-defining film are reflected by the portion of the second reflective layer toward the second refractive index layer portion. The second refractive index layer portion may contact the first refractive layer portion to form an interface therebetween such that light beams emitted from the organic light emission layer and passing through the second refractive index layer portion are reflected at the interface.

Still in the foregoing organic light-emitting display apparatus, the optical layer may further comprise a black matrix that is disposed between the substrate and the corresponding first refractive index layer portion and contacts the second refractive index layer portion. A thickness of the second refractive index layer portion may be substantially the same as a sum of a thickness of the first refractive index layer portion and a thickness of the black matrix. A width of the pixel electrode may be equal to or less than a width of the black matrix. The second refractive index of the second refractive index layer portion is equal to or greater than about 1.8, and the first refractive index of the first refractive index layer portion is equal to or less than about 1.5. The reflectance of each of the pixel electrode and the opposite electrode may be equal to or greater than 90%. The opposite electrode may comprise an inclined portion with respect to the major surface of the substrate, and an angle of the inclined portion is in a range of from about 30° to about 75° with respect to the major surface.

Further in the organic light-emitting display apparatus, the pixel-defining film may comprise a first layer portion that is disposed over the second refractive index layer portion and a second layer portion that is disposed over the first layer portion, and wherein the pixel-defining film has an inclination angle changing point that is formed at an edge of the second layer portion and at which the change of an inclination angle is discontinuous. The first layer portion of the pixel-defining film may be of a first material which is different from that of the second layer portion of the pixel-defining film. The intermediate layer may comprise a charge carrier transport layer comprising a portion that overlaps the second refractive index layer portion when viewed in the direction and is disposed between the pixel-defining film and the second layer. The intermediate layer may comprise a charge carrier injection layer comprising a portion that overlaps the second refractive index layer portion when viewed in the direction and is disposed between the pixel-defining film and the second layer. The second refractive index layer portion may surround the first refractive index layer portion when viewed in the direction.

Another aspect of the invention provides a method of manufacturing an organic light-emitting display apparatus, the method comprising: forming an organic film over a substrate comprising a major surface; selectively irradiating light to an area of the organic film while not irradiating the light to another area of the organic film to form a first refractive index layer portion that is disposed in the non-irradiating area and a second refractive index layer portion that is disposed in the light-irradiating area and contacts the first refractive index layer portion, wherein the first refractive index layer portion has a first refractive index and the second refractive index layer portion has a second refractive index greater than the first refractive index; forming, over the first refractive index layer portion, a pixel electrode that comprises a reflective layer; forming a pixel-defining film over the second refractive index layer portion; forming, over the pixel electrode, an intermediate layer that comprises an organic light emission layer; and forming, over the intermediate layer and the pixel-defining film, an opposite electrode that comprises a reflective layer.

In the foregoing method, the organic film may comprise first particles and second particles having a refractive index greater than that of the first particles. The second particles in the non-irradiating area may move to light-irradiating area while irradiating the light to the light-irradiating area. The method may further comprise, before the forming of the organic film, forming a black matrix over the substrate, wherein the black matrix inhibits the light from reaching the non-irradiating area. The second reflective layer may comprise a portion overlapping the pixel-defining film and curved to form a concave mirror such that light beams emitted from the organic light emission layer and passed through the pixel-defining film are reflected by the portion of the second reflective layer toward the second refractive index layer portion. The second refractive index layer portion may contact the first refractive layer portion to form an interface therebetween such that light beams emitted from the organic light emission layer and passing through the second refractive index layer portion are reflected at the interface.

Additional aspects will be set forth in part in the description which follows and, in part, will be apparent from the description, or may be learned by practice of the presented embodiments.

According to one or more embodiments of the present invention, an organic light-emitting display apparatus includes: a substrate that is divided into a first area and a second area; a low refractive index layer that is disposed in the first area of the substrate; a high refractive index layer that is disposed in the second area of the substrate and contacts the low refractive index layer; a pixel electrode that is disposed on the low refractive index layer and includes a reflective layer; a pixel-defining film that extends from an end portion of the pixel electrode to the second area; an intermediate layer that is disposed on the pixel electrode and includes an organic light emission layer; and an opposite electrode that is disposed on the intermediate layer and the pixel-defining film and includes a reflective layer.

The organic light-emitting display apparatus may further include a black matrix that is disposed between the substrate and the low refractive index layer and has at least one portion contacting the high refractive index layer.

A thickness of the high refractive index layer may be substantially the same as a sum of a thickness of the low refractive index layer and a thickness of the black matrix.

A width of the pixel electrode may be equal to or less than a width of the black matrix.

A refractive index of the high refractive index layer may be equal to or greater than about 1.8, and a refractive index of the low refractive index layer may be equal to or less than about 1.5.

Reflectance of each of the pixel electrode and the opposite electrode may be equal to or greater than 90%.

The opposite electrode may include an inclined portion with respect to the substrate, and an angle of the inclined portion may be in a range of from about 30° to about 75°.

The pixel-defining film may include a first layer that is disposed on the high refractive index layer and a second layer that is disposed on the first layer, and may have an inclination angle changing point that is formed at a boundary between the first layer and the second layer and at which the change of an inclination angle is discontinuous.

According to one or more embodiments of the present invention, a method of manufacturing an organic light-emitting display apparatus includes: forming an organic film on a substrate that is divided into a first area and a second area; forming a low refractive index layer that is disposed in the first area and a high refractive index layer that is disposed in the second area and contacts the low refractive index layer by emitting light to a portion of the organic film corresponding to the second area; forming on the low refractive index layer a pixel electrode that includes a reflective layer; forming a pixel-defining film that extends from an end portion of the pixel electrode to the second area; forming on the pixel electrode an intermediate layer that includes an organic light emission layer; and forming on the intermediate layer and the pixel-defining film an opposite electrode that includes a reflective layer.

The organic film may include high refractive index particles.

The method may further include, before the forming of the organic film, forming a black matrix in the first area of the substrate.

The forming of the low refractive index layer and the high refractive index layer may include forming the low refractive index layer and the high refractive index layer by emitting light by using the black matrix as a mask.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
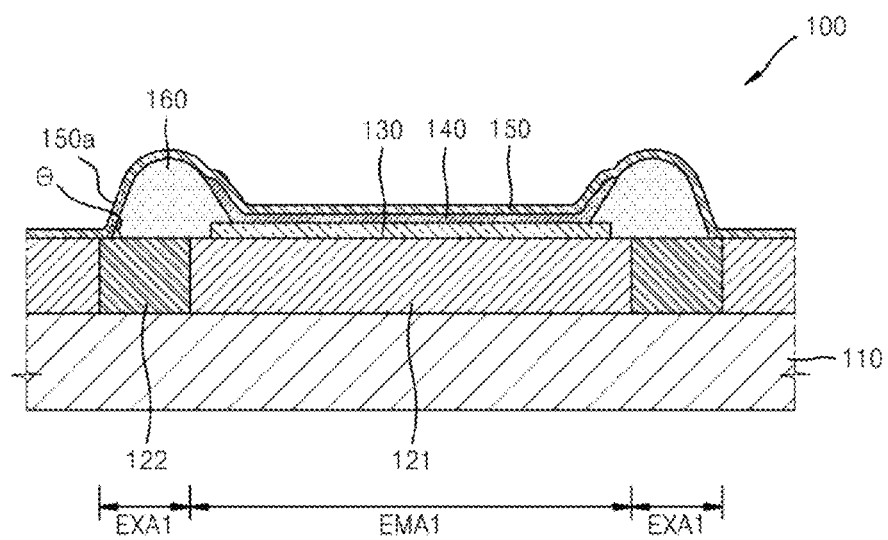
FIG. 1 is a cross-sectional view illustrating an organic light-emitting display apparatus according to an embodiment of the present invention.

The advantages and features of the present invention and methods of achieving the advantages and features will be described more fully with reference to the accompanying drawings, in which embodiments of the invention are shown. The invention may, however, be embodied in many different forms and should not be construed as being limited to the embodiments set forth herein.

The present invention will become more apparent to one of ordinary skill in the art by describing in detail embodiments thereof with reference to the accompanying drawings. In the drawings, the same or corresponding elements are denoted by the same reference numerals, and a repeated explanation thereof will not be given.

It will be understood that although the terms "first", "second", etc. may be used herein to describe various elements, these elements should not be limited by these terms. These elements are only used to distinguish one element from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being "formed on," another layer, region, or element, it can be directly or indirectly formed on the other layer, region, or element. That is, for example, intervening layers, regions, or elements may be present.

Sizes of elements may be exaggerated for convenience of explanation. In other words, since sizes and thicknesses of elements in the drawings are arbitrarily illustrated for convenience of explanation, the following embodiments are not limited thereto.

Figure 2:
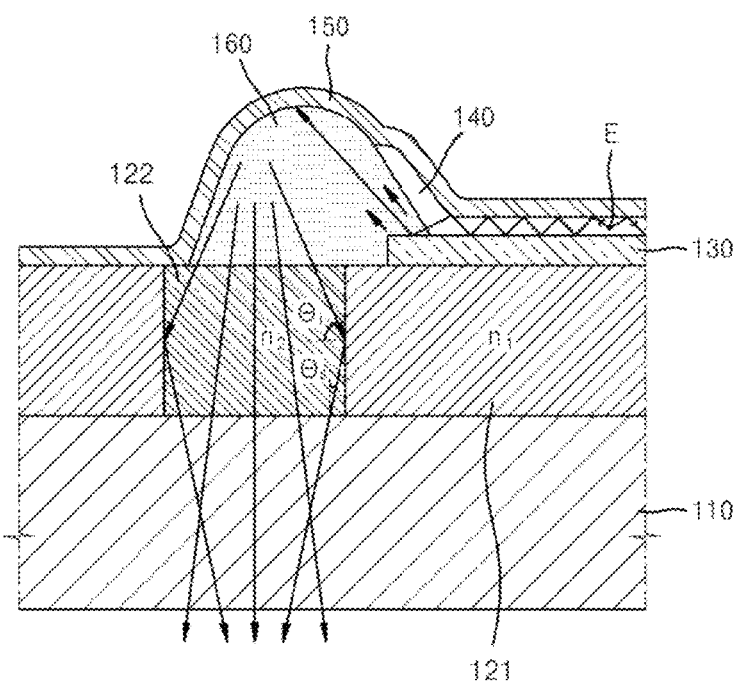
FIG. 2 is a conceptual cross-sectional view for explaining a light extraction principle of the organic light-emitting display apparatus of FIG. 1.

FIG. 1 is a cross-sectional view illustrating an organic light-emitting display apparatus 100 according to an embodiment of the present invention. FIG. 2 is a conceptual cross-sectional view for explaining a light extraction principle of the organic light-emitting display apparatus 100 of FIG. 1.

Referring to FIGS. 1 and 2, the organic light-emitting display apparatus 100 includes a substrate 110 that is divided into a first area EMA1 and a second area EXA1, a low refractive index layer 121 that is disposed in the first area EMA1 of the substrate 110, a high refractive index layer 122 that is disposed in the second area EXA1 of the substrate 110 and contacts the low refractive index layer 121, a pixel electrode 130 that is disposed on the low refractive index layer 121 and includes a reflective layer, a pixel-defining film 160 that extends from an end portion of the pixel electrode 130 to the second area EXA1, an intermediate layer 140 that is disposed on the pixel electrode 130 and includes an organic light emission layer, and an opposite electrode 150 that is disposed on the intermediate layer 140 and the pixel-defining film 160 and includes a reflective layer.

In embodiments, the low refractive index layer 121 and the high refractive index layer 122 are portions of an optical layer which is formed on the substrate. As discussed below, the optical layer may comprise a black matrix. The low refractive index layer 121 has a first refractive index and the high refractive index layer 122 has a second refractive index which is substantially greater than the first refractive index such that light beams emitted from the organic light emission layer and passing through the high refractive index layer portion toward can be reflected at an interface between the low refractive index layer 121 and the high refractive index layer 122. As shown in FIG. 1, the high refractive index layer portion 122 may be disposed between two immediately neighboring low refractive index layer portions 121.

The pixel electrode 130 may include a reflective layer. For example, the reflective layer may include at least one selected from the group consisting of silver (Ag), magnesium (Mg), aluminum (Al), platinum (Pt), palladium (Pd), gold (Au), nickel (Ni), neodymium (Nd), iridium (Ir), and chromium (Cr). A transparent or a semi-transparent electrode layer formed of at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO) may be further disposed on the reflective layer.

The pixel electrode 130 may include three layers, for example, an ITO layer, an Ag layer, and an ITO layer, and reflectance of the pixel electrode 130 may be increased by allowing the Ag layer to have a thickness equal to or greater than 1000 Å. Reflectance of the pixel electrode 130 may be equal to or greater than 90%.

The intermediate layer 140 may include an organic light emission layer, and may further include at least one selected from a hole injection layer (HIL), a hole transport layer (HTL), an electron transport layer (ETL), and an electron injection layer (EIL). The organic light emission layer may emit red, green, blue, or white light.

The intermediate layer 140 that emits white light may have any of various structures, for example, a structure in which at least an emission material that emits red light, an emission material that emits green light, and an emission material that emits blue light are sequentially stacked.

Alternatively, in order to emit white light, the intermediate layer 140 may have a structure in which at least an emission material that emits red light, an emission material that emits green light, and an emission material that emits green light are mixed with one another.

The blue, green, and red light is exemplary, and the present embodiment is not limited thereto. That is, as long as white light may be emitted, combinations other than a combination of red, green, and blue light may be used.

The opposite electrode 150 may include a reflective layer, and the reflective layer may include at least one selected from the group consisting of Ag, Mg, Al, Li, calcium (Ca), copper (Cu), lithium fluoride (LiF)/Ca, LiF/Al, MgAg, and CaAg. Reflectance of the opposite electrode 150 may be equal to or greater than 90%.

Since both the pixel electrode 130 and the opposite electrode 150 of the organic light-emitting display apparatus 100 of FIG. 1 include the reflective layers, light may not be emitted to the outside by inhibiting the light from transmitting through the pixel electrode 130 or the opposite electrode 150. That is, an optical waveguide is formed in an emission area where the intermediate layer 140 is disposed due to the pixel electrode 130 and the opposite electrode 150. Light that is emitted from the intermediate layer 140 may propagate to an area outside the emission area where the pixel electrode 130 is disposed, that is, to an area where the pixel-defining film 160 is disposed and thus may be reflected by the opposite electrode 150 disposed on the pixel-defining film 160 to be emitted to the outside.

The opposite electrode 150 has an inclined portion 150a with respect to the substrate 110, and an angle θ of the inclined portion 150a may be in a range of from about 30° to about 75° with respect to a direction that is substantially parallel to the pixel electrode 130. The pixel-defining film 160 that is disposed under the inclined portion 150a of the opposite electrode 150 may also include an inclined portion having an angle that is in a range of from about 30° to about 75°.

In this range of the angle θ, the opposite electrode 150 may efficiently emit to the outside light that is emitted from the intermediate layer 140 and reaches the inclined portion 150a.

Referring to FIG. 2, light that is emitted from one portion E of the intermediate layer 140 may be reflected by the pixel electrode 130 and the opposite electrode 150 each including the reflective layer and may propagate to an outer edge of the pixel electrode 130.

The light propagating to the outer edge of the pixel electrode 130 may be reflected toward the substrate 110 by the opposite electrode 150 that is disposed on the pixel-defining film 160 and includes the reflective layer. In embodiments, the opposite electrode includes a curved portion which forms a concave mirror such that light beams reflected by the concave mirror transmit toward the high refractive index layer 122.

The light that is emitted from the intermediate layer 140 may pass through the pixel-defining film 160 at various angles, may be reflected by the opposite electrode 150, and may be incident at various angles on the high refractive index layer 122.

A refractive index $n_2$ of the high refractive index layer 122 is greater than a refractive index $n_1$ of the low refractive index layer 121. When an incidence angle $\theta_i$ of light that is incident from the high refractive index layer 122 on the low refractive index layer 121 is equal to or greater than a specific value, that is, a critical angle $\sin^{-1}(n_1/n_2)$ for total reflection, the light that is incident on the low refractive index layer 121 may not pass through the low refractive index layer 121 and may be reflected at a boundary surface between the high refractive index layer 122 and the low refractive index layer 121. The refractive index $n_2$ of the high refractive index layer 122 may be equal to or greater than about 1.8, and the refractive index $n_1$ of the low refractive index layer 121 may be equal to or less than about 1.5.

Accordingly, since an optical path is changed, an incidence angle $\theta_s$ of light that is incident on the substrate 110 may be $90°-\theta_i$ and thus may be less than the incidence angle $\theta_i$. That is, an optical path of emitted light may be changed toward a normal direction.

According to a comparative example (not shown) in which the high refractive index layer 122 is not provided, light that is incident at a specific angle or more on the substrate 110 from among light reflected by the opposite electrode 150 may be totally reflected at a boundary surface between the low refractive index layer 121 and the substrate 110 and thus may not be emitted to the outside. That is, light extraction efficiency may be reduced.

However, according to the present embodiment, since the high refractive index layer 122 is disposed under the pixel-defining film 160, light that is reflected by the opposite electrode 150 and travels forward at a specific angle or more may be prevented from being lost, and thus light extraction efficiency of the organic light-emitting display apparatus 100 may be improved.

Figure 3:
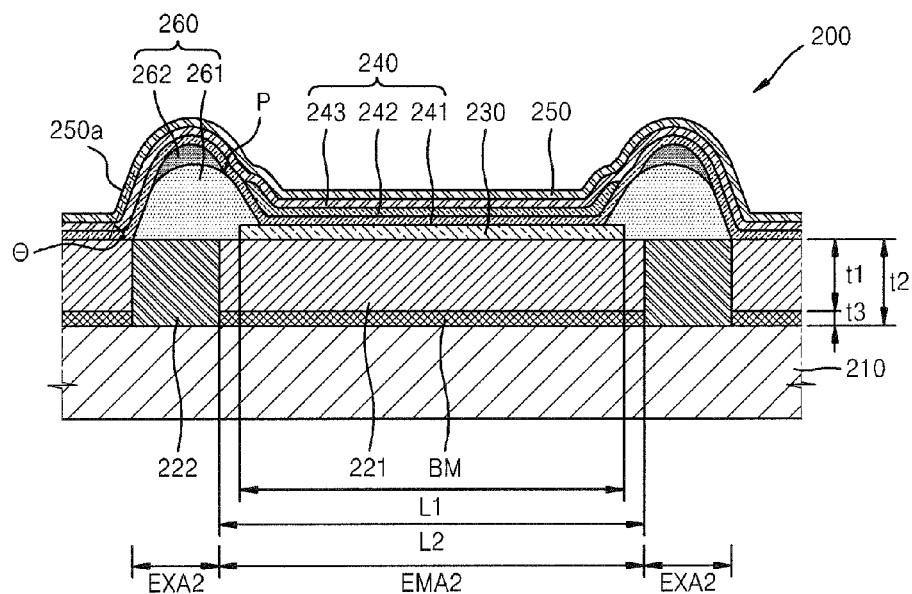
FIG. 3 is a cross-sectional view illustrating an organic light-emitting display apparatus according to another embodiment of the present invention.

FIG. 3 is a cross-sectional view illustrating an organic light-emitting display apparatus 200 according to another embodiment of the present invention.

Referring to FIG. 3, the organic light-emitting display apparatus 200 includes a substrate 210 that is divided into a first area EMA2 and a second area EXA2, a low refractive index layer 221 that is disposed in the first area EMA2 of the substrate 210, a high refractive index layer 222 that is disposed in the second area EXA2 of the substrate 210 and contacts the low refractive index layer 221, a pixel electrode 230 that is disposed on the low refractive index layer 221 and includes a reflective layer, a pixel-defining film 260 that extends from an end portion of the pixel electrode 230 to the second area EXA2, an intermediate layer 240 that is disposed on the pixel electrode 230 and includes an organic light emission layer, and an opposite electrode 250 that is disposed on the intermediate layer 240 and the pixel-defining film 260 and includes a reflective layer.

A black matrix BM that has at least one portion contacting the high refractive index layer 222 may be disposed between the substrate 210 and the low refractive index layer 221. A thickness t2 of the high refractive index layer 222 may be substantially the same as a sum of a thickness t1 of the low refractive index layer 221 and a thickness t3 of the black matrix BM. The black matrix BM may be disposed to correspond to the pixel electrode 230, and a width L2 of the black matrix BM may be equal to or greater than a width L1 of the pixel electrode 230.

The black matrix BM may be disposed in an area, that is, the first area EMA2, where light is not emitted to the outside, and may prevent visibility from being reduced when external light is reflected by a metal or the like included in the organic light-emitting display apparatus 200. Accordingly, since a polarizer that is typically used to inhibit external light from reflection does not need to be provided, a phenomenon where light is absorbed by the polarizer and light extraction efficiency is reduced may be avoided.

The black matrix BM may also function as a mask for forming the high refractive index layer 222, which will be explained below.

Each of the pixel electrode 230 and the opposite electrode 250 may include a reflective layer, and reflectance of each of the pixel electrode 230 and the opposite electrode 250 may be equal to or greater than about 90%.

The opposite electrode 250 may have an inclined portion 250a with respect to the substrate 210, and an angle $\theta$ of the inclined portion 250a may be in a range of from about 30° to about 75° with respect to a direction that is substantially parallel to the pixel electrode 230. In the range of the angle $\theta$, the opposite electrode 250 may efficiently emit to the outside light that is emitted from the intermediate layer 240 and reaches the inclined portion 250a.

The intermediate layer 240 may include an organic light emission layer 242 that emits red, green, blue, or white light. A first common layer 241 such as an HIL and/or an HTL may be disposed between the pixel electrode 230 and the organic light emission layer 242, and a second common layer 243 such as an ETL and an EIL may be disposed between the organic light emission layer 242 and the opposite electrode 250.

The first and second common layers 241 and 243 may be formed to be commonly provided in a plurality of pixels included in the organic light-emitting display apparatus 200.

The pixel-defining film 260 may include a first layer 261 that is disposed on the high refractive index layer 222 and a second layer 262 that is disposed on the first layer 261, and may have an inclination angle changing point P that is formed at a boundary between the first layer 261 and the second layer 262 and at which the change of an inclination angle is discontinuous.

The inclination changing point P may prevent or inhibit light that is incident on the pixel-defining film 260 from continuously propagating to a side surface along a boundary between the pixel-defining film 260 and the opposite electrode 250 and being lost, thereby improving light extraction efficiency.

Each of the first layer 261 and the second layer 262 may include an organic material, and the organic materials of the first layer 261 and the second layer 262 may be the same or different from each other.

For example, each of the first layer 261 and the second layer 262 may include, but is not limited to, polyimide (PI).

Although not shown in FIG. 3, an encapsulation unit or encapsulation plate may be disposed on the opposite electrode 250. The encapsulation unit may be formed to include a substrate including a glass material, a metal film, or an encapsulation thin film that is formed by alternately stacking an organic insulating film and an inorganic insulating film.

The second layer 262 of the pixel-defining film 260 may function as a spacer that adjusts an interval between the substrate 210 and the encapsulation unit.

Since both the pixel electrode 230 and the opposite electrode 250 of the organic light-emitting display apparatus 200 of FIG. 3 include the reflective layers, light may not be emitted to the outside by inhibiting light beams from transmitting through the pixel electrode 230 or the opposite electrode 250. That is, light that is emitted from the organic light emission layer 242 may propagate to an area outside the pixel electrode 230, that is, to an area where the pixel-defining film 260 is disposed and thus may be reflected by the opposite electrode 250 disposed on the pixel-defining film 260 to be emitted to the outside.

The light reflected by the opposite electrode 250 may be incident at various angles on the high refractive index layer 222, and part of the light reflected by the opposite electrode 250 may be totally reflected at a boundary surface between the high refractive index layer 222 and the low refractive index layer 221 to the substrate 210. The high refractive index layer 222 may have a refractive index equal to or greater than about 1.8, and the low refractive index layer 221 may have a refractive index equal to or less than about 1.5.

Also, part of the light reflected by the opposite electrode 250 may be totally reflected at a boundary surface between the high refractive index layer 222 and the black matrix BM to the substrate 210. The black matrix BM may have a refractive index of about 1.5.

In FIG. 3, since the high refractive index layer 222 is disposed under the pixel-defining film 260 and thus light that is reflected by the opposite electrode 250 and travels forward at a specific angle or more is totally reflected at the boundary surface between the high refractive index layer 222 and the low refractive index layer 221 or the boundary surface between the high refractive index layer 222 and the black matrix BM, an optical path may be changed.

Light whose optical path is changed may be emitted to the outside without being totally reflected at a boundary surface between the high refractive index layer 222 and the substrate 210, thereby improving light extraction efficiency.

Figure 4:
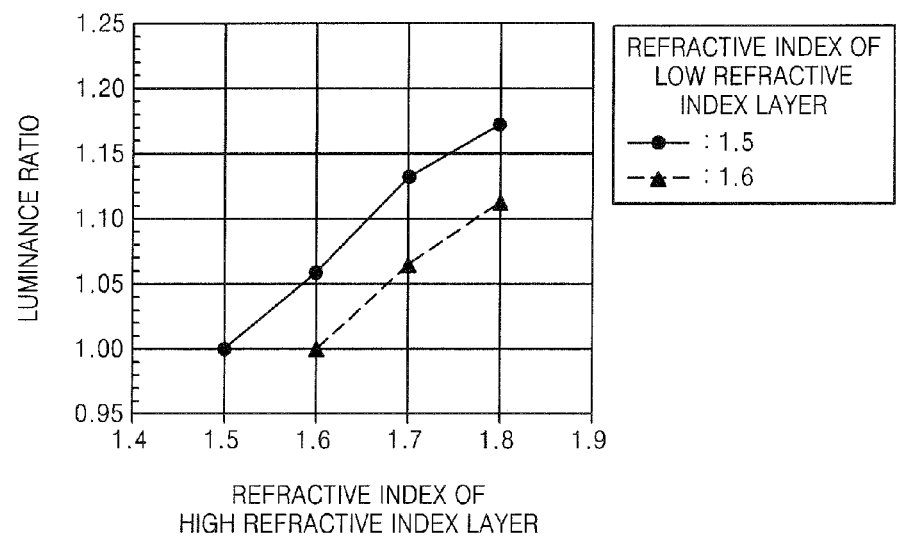
FIG. 4 is a graph illustrating a relationship between a luminance ratio of extracted light and a refractive index of a high refractive index layer in the organic light-emitting display apparatus of FIG. 3.

FIG. 4 is a graph illustrating a relationship between a refractive index of the high refractive index layer 222 and a luminance ratio of extracted light in the organic light-emitting display apparatus 200 of FIG. 3.

FIG. 4 is a simulation result showing a relationship between a luminance ratio and a refractive index of the high refractive index layer 222 (see FIG. 3) when the low refractive index layer 221 (see FIG. 3) has a refractive index of 1.5 and a refractive index of 1.6.

Referring to the graph, assuming that a luminance ratio when a refractive index of the low refractive index layer 221 and a refractive index of the high refractive index layer 222 are the same is 1.00, it is found that a luminance ratio increases as a refractive index of the high refractive index layer 222 increases.

In particular, it is found that when a refractive index of the low refractive index layer 221 is 1.5 and a refractive index of the high refractive index layer 222 is 1.8, a luminance ratio increases by about 17%. Accordingly, light extraction efficiency may be greatly improved when the low refractive index layer 221 is configured to have a refractive index equal to or less than 1.5 and the high refractive index layer 222 is configured to have a refractive index equal to or greater than 1.8.

Figure 5A:
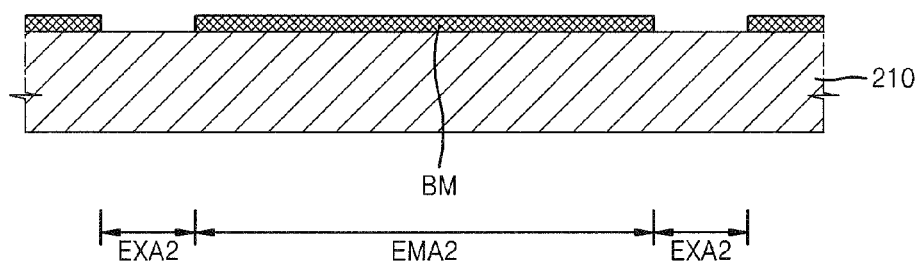
FIGS. 5A through 5C are cross-sectional views for explaining part of a method of manufacturing the organic light-emitting display apparatus of FIG. 3, according to an embodiment of the present invention.
Figure 5B:
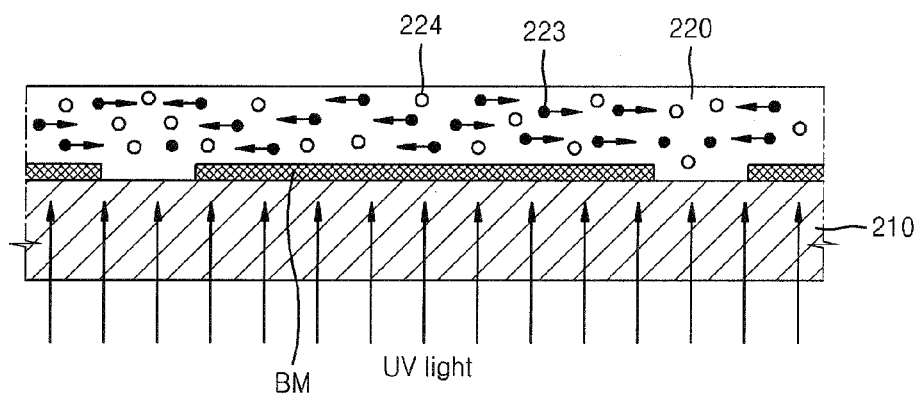
Figure 5C:
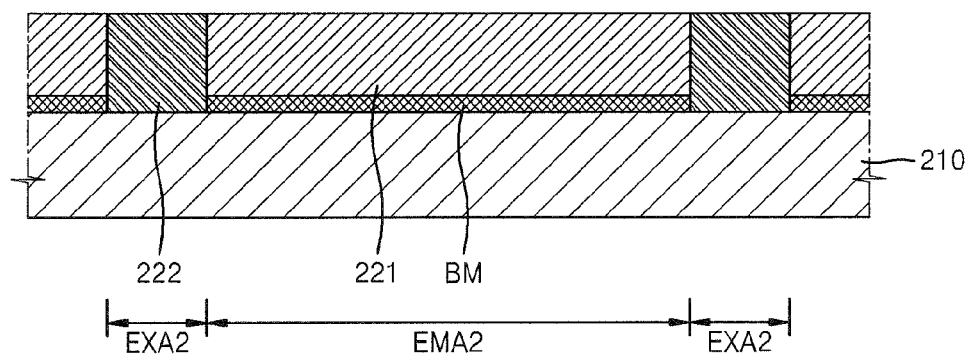

FIGS. 5A through 5C are cross-sectional views for explaining part of a method of manufacturing the organic light-emitting display apparatus 200 of FIG. 3, according to an embodiment of the present invention.

Referring to FIG. 5A, the black matrix BM may be formed in the first area EMA2 of the substrate 210 that is divided into the first area EMA2 and the second area EXA2.

Referring to FIG. 5B, an organic film 220 may be formed on the substrate 210 to cover the black matrix BM. The organic film 220 may include high refractive index particles 223 and low refractive index particles 224. The high refractive index particles 223 have a refractive index greater than that of the low refractive index particles 224.

The organic film 220 may be formed of a material that may be cured by ultraviolet light. Ultraviolet light may be irradiated to the organic film 220 that is disposed in the second area EXA2 of the substrate 210 by using the black matrix BM as a mask.

Once the ultraviolet light is irradiated to the organic film 220 that is disposed in the second area EXA2, the high refractive index particles 223 that are included in the organic film 220 may move to an area where the ultraviolet light is irradiated and may be cured by the irradiated ultraviolet light.

Referring to FIG. 5C, the low refractive index layer 221 is formed in an area where the ultraviolet light is blocked by the black matrix BM, that is, in the first area EMA2, and the high refractive index layer 222 may be formed in the area where the ultraviolet light is irradiated, that is, in the second area EXA2 of the substrate 210.

The high refractive index layer 222 may be formed to contact the low refractive index layer 221 and the black matrix BM.

Although not shown in FIGS. 5A through 5C, the method of manufacturing the organic light-emitting display apparatus 200 may include forming on the low refractive index layer 221 the pixel electrode 230 (see FIG. 3) including a reflective layer, forming the pixel-defining film 260 (see FIG. 3) that extends from an end portion of the pixel electrode 230 to the second area EXA2, forming on the pixel electrode 230 the intermediate layer 240 (see FIG. 3) including the organic light emission layer 242 (see FIG. 3), and forming on the intermediate layer 240 and the pixel-defining film 260 the opposite electrode 250 (see FIG. 3) including a reflective layer.

Although not shown in FIGS. 5A through 5C, in order to manufacture the organic light-emitting display apparatus 100 of FIG. 1, the low refractive index layer 121 (see FIG. 1) and the high refractive index layer 122 (see FIG. 1) may be formed on the substrate 110 by forming an organic film (not shown) on the substrate 110 (see FIG. 1) and then irradiating ultraviolet light by using a mask (not shown) including an opening corresponding to the second area EXA1.

As described above, according to the one or more of the above embodiments of the present invention, an organic light-emitting display apparatus and a method of manufacturing the same may improve light extraction efficiency.

While one or more embodiments of the present invention have been described with reference to the figures, it will be understood by those of ordinary skill in the art that various changes in form and details may be made therein without departing from the spirit and scope of the present invention as defined by the following claims. Accordingly, the true technical scope of the present invention is defined by the technical spirit of the appended claims.

What is claimed is:

1. An organic light-emitting display apparatus comprising:
a substrate comprising a first major surface and a second major surface facing away from the first major surface;
a pixel array formed over the first major surface and comprising a plurality of light emitting pixels configured to emit light beams toward the substrate such that information is displayed on the second major surface of the substrate;
a light emitting pixel of the pixel array comprises a pixel electrode, an organic light emitting layer formed over the pixel electrode, and a pixel-defining wall next to the pixel electrode and the organic light emitting layer, wherein the pixel array further comprises a common electrode formed over the pixel-defining wall and the organic light emitting layer;

an optical layer formed between the first major surface and the pixel array, the optical layer comprising a first refractive index layer and a second refractive index layer;

wherein the first refractive index layer a first refractive index and is located under the pixel electrode such that the pixel electrode overlaps the first refractive index layer when viewed in a direction perpendicular to the first major surface; and wherein the second refractive index layer has a second refractive index greater than the first refractive index and is located under the pixel-defining wall such that the pixel-defining wall overlaps the second refractive index layer when viewed in the direction, wherein the second refractive index layer contacts the first refractive index layer to form an interface therebetween such that at least part of light beams reflected on the common electrode and directed to the second refractive index layer are totally reflected on the interface and directed toward the substrate without entering the first refractive index layer.

2. The organic light-emitting display apparatus of claim 1, wherein the common electrode comprises a curved portion to form a concave mirror over the wall.

3. The organic light-emitting display apparatus of claim 1, wherein the second refractive index layer surrounds the first refractive index layer when viewed in the direction.

4. The organic light-emitting display apparatus of claim 1, further comprising a black matrix that is disposed between the substrate and the pixel electrode and contacts the second refractive index layer portion.

5. The organic light-emitting display apparatus of claim 4, wherein a thickness of the second refractive index layer is substantially the same as the sum of a thickness of the first refractive index layer and a thickness of the black matrix.

6. The organic light-emitting display apparatus of claim 4, wherein the pixel electrode has a width equal to or less than that of the black matrix.

7. The organic light-emitting display apparatus of claim 1, wherein the second refractive index of is equal to or greater than about 1.8, and the first refractive index equal to or less than about 1.5.

8. The organic light-emitting display apparatus of claim 1, wherein reflectance of each of the pixel electrode and the common electrode is equal to or greater than 90%.

9. The organic light-emitting display apparatus of claim 1, wherein the common electrode comprises an inclined portion with respect to the first major surface of the substrate, and an angle of the inclined portion is in a range of from about 30° to about 75° with respect to the first major surface.

10. The organic light-emitting display apparatus of claim 1, wherein the pixel-defining wall comprises a first portion that is disposed over the second refractive index layer and a second portion that is disposed over the first layer, and wherein the pixel-defining film has an inclination angle changing point that is formed at an edge of the second portion and at which the change of an inclination angle is discontinuous.

11. The organic light-emitting display apparatus of claim 1, wherein the first portion of the pixel-defining wall is of a first material which is different from that of the second portion of the pixel-defining wall.

12. The organic light-emitting display apparatus of claim 1, wherein the light emitting pixel further comprises a charge carrier transport layer comprising a portion that overlaps the second refractive index layer when viewed in the direction.

13. The organic light-emitting display apparatus of claim 1, wherein the light emitting pixel further comprises a charge carrier injection layer comprising a portion that overlaps the second refractive index layer viewed in the direction.

* * * * *